United States Patent
Garakani et al.

(10) Patent No.: US 7,908,399 B2
(45) Date of Patent: Mar. 15, 2011

(54) COMPRESSION OF REPEATED PATTERNS IN FULL BANDWIDTH CHANNELS OVER A PACKET NETWORK

(75) Inventors: Mehryar Khalili Garakani, Westlake Village, CA (US); Herbert Michael Wildfeuer, Santa Barbara, CA (US); Prasad Miriyala, Union City, CA (US); Henry Diep, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 1733 days.

(21) Appl. No.: 10/449,953

(22) Filed: May 30, 2003

(65) Prior Publication Data

US 2005/0015514 A1   Jan. 20, 2005

(51) Int. Cl.
  *G06F 15/16* (2006.01)
(52) U.S. Cl. ............... 709/247; 341/41; 341/51; 341/59; 341/63
(58) Field of Classification Search .................... 341/51, 341/55, 59, 63, 41; 382/244; 709/246, 247
See application file for complete search history.

(56) References Cited

U.S. PATENT DOCUMENTS

| | | | | |
|---|---|---|---|---|
| 4,626,824 A * | 12/1986 | Larson | ............. | 341/95 |
| 4,626,829 A * | 12/1986 | Hauck | ............. | 341/63 |
| 4,988,998 A * | 1/1991 | O'Brien | ............. | 341/55 |
| 5,049,880 A * | 9/1991 | Stevens | ............. | 341/63 |
| 5,357,546 A * | 10/1994 | Meriwether et al. | ...... | 375/240 |
| 5,406,278 A * | 4/1995 | Graybill et al. | ............. | 341/51 |
| 5,406,279 A * | 4/1995 | Anderson et al. | ............. | 341/51 |
| 5,521,597 A * | 5/1996 | Dimitri | ............. | 341/51 |
| 5,617,552 A * | 4/1997 | Garber et al. | ............. | 711/1 |
| 5,689,255 A * | 11/1997 | Frazier et al. | ............. | 341/63 |
| 5,940,540 A * | 8/1999 | Cornelissen | ............. | 382/245 |
| 5,956,724 A * | 9/1999 | Griffiths | ............. | 707/101 |
| 6,388,585 B1 * | 5/2002 | Lacerda | ............. | 341/51 |
| 6,416,410 B1 * | 7/2002 | Abou-Samra et al. | ...... | 463/31 |
| 6,657,561 B1 * | 12/2003 | Hanna | ............. | 341/50 |
| 6,657,565 B2 * | 12/2003 | Kampf | ............. | 341/51 |
| 2002/0097701 A1 * | 7/2002 | Lupien et al. | ............. | 370/338 |
| 2004/0228533 A1 * | 11/2004 | Adelmann | ............. | 382/232 |

* cited by examiner

*Primary Examiner* — Duyen M Doan
(74) *Attorney, Agent, or Firm* — Marger, Johnson & McCollom, P.C.

(57) ABSTRACT

A network device is disclosed. The network device includes a port to allow the device to communicate on a full bandwidth channel, a main processor to control reception and transmission of data and a compressor. The compressor identifies repeated fixed sequences in the data, and replaces repeated fixed sequences with an identifier sequence, a count of repetitions and the fixed sequence. The network device may have a decompressor instead of, or in addition to, the compressor that can decompress received data that is compressed.

30 Claims, 3 Drawing Sheets

US 7,908,399 B2

COMPRESSION OF REPEATED PATTERNS IN FULL BANDWIDTH CHANNELS OVER A PACKET NETWORK

BACKGROUND

A point-to-point data transmission channel over a packet network that uses out-of-band signaling allows the entire channel to be used for data. This is often referred to as 'clear channel,' and may also be referred to here as a full-bandwidth channel. In an IP network, these channels can carry many different types of data/signaling transport applications, such as X.25, Frame Relay, ISDN, Cellular, Signaling System 7 (SS7), or other serial protocols.

Many of these data and signaling transport applications use a serial data link protocol referred to as HDLC (High-level Data Link Control). The data link layer is defined in the Open System Interconnection model as the layer providing data packet encoding and decoding, furnishing transmission protocol knowledge and management, error handling in the physical layer, flow control and frame synchronization. HDLC typically provides error handling and flow control.

In addition to HDLC itself, there are several derivatives or HDLC-related protocols. These include Link Access Procedure Balanced (LAPB), Link Access Procedure D-channel (LAPD), Synchronized Data Link Control (SDLC), as well as SS7. Many other protocols that do not rely directly upon HDLC rely upon similar framing and flagging structures.

In idle times, many HDLC and HDLC-similar protocols regenerate flags. A flag is typically a fixed byte sequence that can be repeated frequently. In a data transmission, the flag sequence typically indicates the beginning or end of a block of data, the data of which is marked for a particular purpose.

Eliminating flags before transmission on one end and regenerating them on the remote end would allow lossless compression for many types of serial protocols used over a clear channel.

SUMMARY

A network device is disclosed. The network device includes a port to allow the device to communicate on a full bandwidth channel, a main processor to control reception and transmission of data and a compressor. The compressor identifies repeated fixed sequences in the data, and replaces repeated fixed sequences with an identifier sequence, a count of repetitions and the fixed sequence. The network device may have a decompressor instead of, or in addition to, the compressor that can decompress received data that is compressed. The decompressor locates the identifier sequence and then repeats the fixed sequence up to the count to produce decompressed data.

BRIEF DESCRIPTION OF THE DRAWINGS

Embodiments of the invention may be best understood by reading the disclosure with reference to the drawings, wherein.

DETAILED DESCRIPTION OF THE EMBODIMENTS

Figure 1:
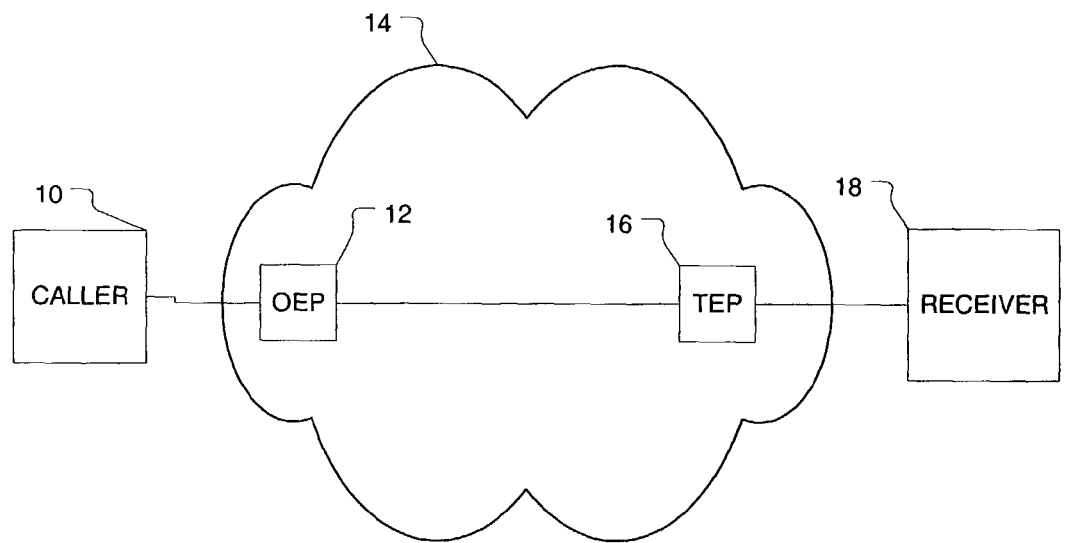
FIG. 1 is an embodiment of a data network.

FIG. 1 shows an embodiment of a data network. A caller 10 may be a data equipment desiring to transmit data across the packet network 14 to the receiving station 18 using a serial protocol.

In the above example endpoint 12 is the point at which the data enters the data network 14, and may be referred to as the origination endpoint. The endpoint 16 would be referred to as the termination endpoint in the above scenario. It must be noted that the data can flow either way, so the originating endpoint is that which will transmit the data of any given transaction, and the terminating endpoint is that which receives the data. These endpoints may be any one of a number of network devices, including gateways.

For purposes of this discussion, the transmission channel between these two devices is assumed to be 'clear channel.' This may also be referred to as a full-bandwidth channel. In a full-bandwidth channel, signaling is done out of band, so the entire bandwidth of the channel is available for data.

If the data networks, or at least the endpoints, rely upon an HDLC (High-level Data Link Control) protocol, or an HDLC-like protocol with flags and framing, it is possible to compress the transmissions by removing repetitions of flags and regenerating the identical number of flags at the remote end. In HDLC, flags are used to indicate the beginnings or ends of data segments having a particular significance.

Figure 2:
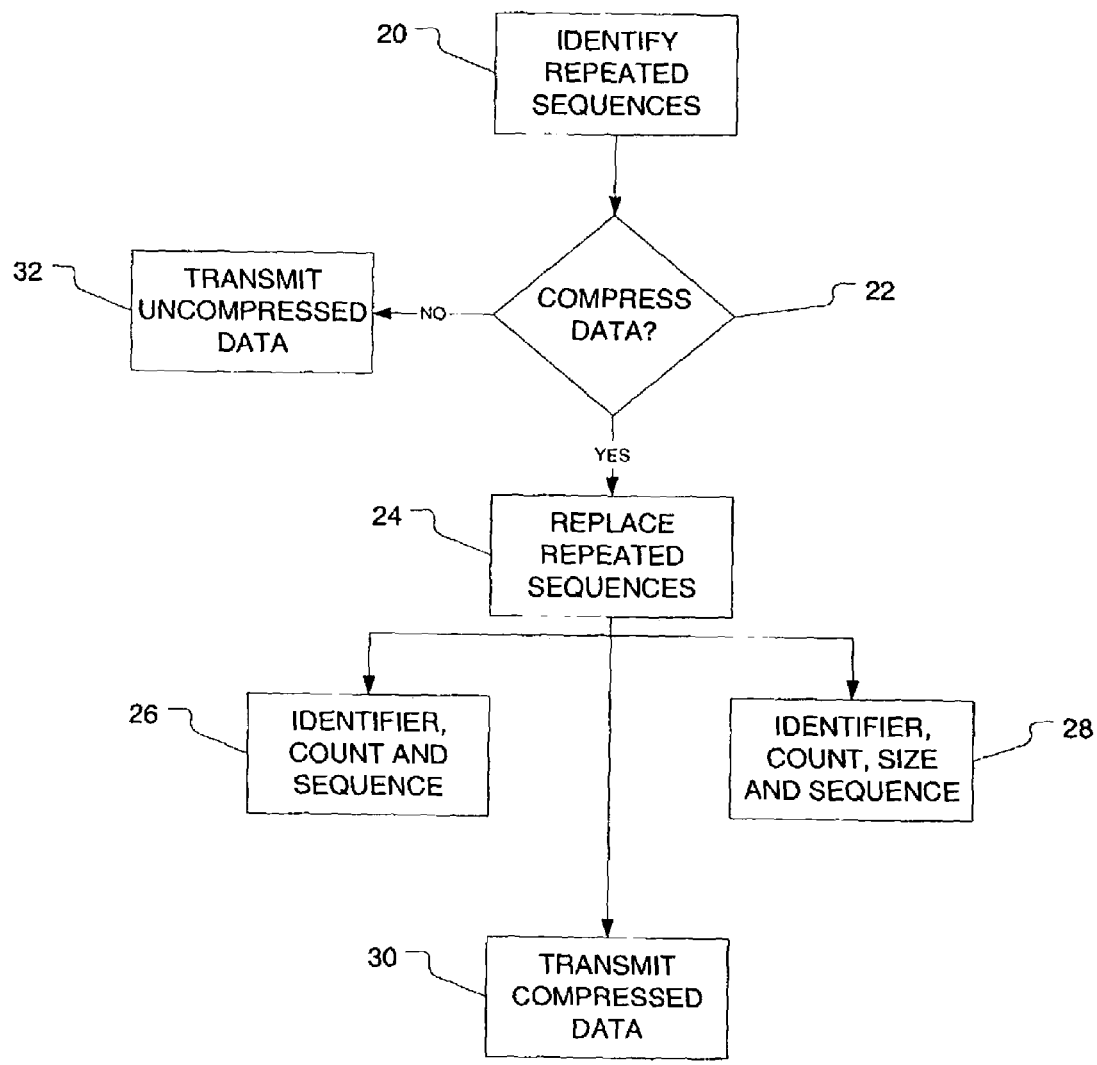
FIG. 2 is a flowchart of an embodiment of a method to perform flag compression.

By removing and regenerating the exact number of flags, it would reduce the amount of bandwidth used, freeing up bandwidth for other transmissions. This is contrasted with removing the flags, which may appear benign, but can have detrimental effect on data communication in case the gateways have incorrectly identified a non-flag repeat sequence in a digital channel as HDLC flags. The compression would be done at the transmitting, or origination endpoint, and the decompression, or reconstruction, of the full packets and flags would be done at the terminating endpoint. An example of such a method of compression is shown in FIG. 2.

At 20, repeated sequences such as flags are identified in the data stream to be transmitted. In HDLC and HDLC-like protocols, the data can be accompanied by a large amount of repeated data due to flags. As will be discussed further, application of embodiments of the invention is not limited to HDLC or similar protocols. HDLC does serve as an example of flagging protocols to which this may be applied.

Prior to performing the compression, the compressor or encoder must first determine if compression will result in an actual compression of data. As will be discussed with regard to the identifier sequence, it is possible that applying the compression techniques discussed below may actually result in an expansion of data. If the compressor determines that the resulting data size is larger than the uncompressed data at 22, the data is transmitted uncompressed at 32.

If the compressor determines that performing the compression will result in a compression of the data size, the process then replaces the repeated sequences at 24. For example, the data stream may have a repeated sequence of 01111110. If this is repeated in the uncompressed data, it is possible to replace the byte sequence of 01111110 with an identifier sequence, a count of repetitions, and the repeated, fixed sequence.

For example, a segment of the data may start as:
01111110 01111110 01111110 01111110 01111110

This would be changed to have an identifier sequence, such as 10000001, the count of repetitions, in this case 00000101

(5 repetitions), and the sequence itself 01111110. The 5-byte sequence of repetitions becomes the 3-byte sequence:

1000001 00000101 01111110.

The identifier sequence 10000001 would identify that there was a repeated sequence of a given number. The decompressor will use that to reconstruct the data to the original size, with no loss. The above example assumes that the data uses an 8-bit wide flag field at 26, where the repeated sequence is replaced with the identifier, the repetition count and the fixed sequence itself.

In some examples, the flags or other repeated sequences may not be 8-bits. Flag sharing generally involves the last bit of a flag being used as the first bit of the next flag. This results in an effective 7-bit flag transmission. The repeated sequence is now repeated over a much larger sequence size, typically 7 bytes. In this case, the replacement data would be the identifier sequence, the repetition count, the string size, and the string type. The string size is the length of the repeated string and the string type is the exact byte sequence that is repeated in uncompressed text. The string type and the fixed sequence are analogous in that they are the sequence being replaced, and may both be referred to as the fixed or repeated sequence.

Application of this invention could occur on the bit boundary, but resources may be an issue.

Returning to the process of FIG. 2, the compressed data is then transmitted at 30. During the replacement process of 24, it must be noted that the identifier sequence may have a unique meaning when it occurs within the uncompressed data. The process should differentiate between the identifier being used to identifier a run count and the sequence to repeated up to that count, and the identifier sequence occurring in data. In one embodiment, the single occurrences of the identifier in uncompressed text may have a double occurrence substituted for it. The decompressor would determine that two occurrences of the identifier sequence, without a count and fixed sequence, would indicate that the identifier sequence occurred in the uncompressed text. This is addressed more clearly by the decompression process, an embodiment of which is shown in FIG. 3.

Figure 3:
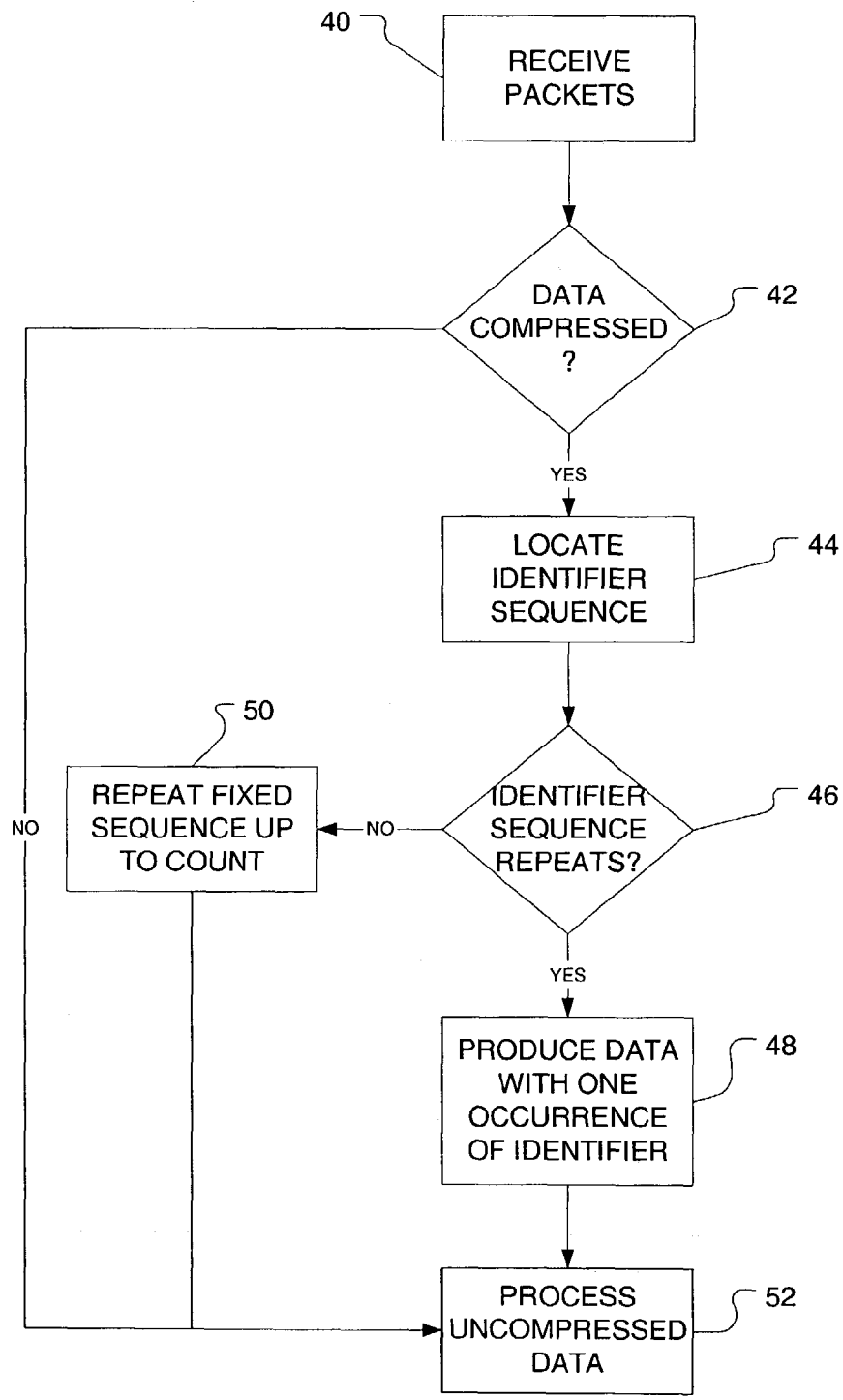
FIG. 3 is a flowchart of an embodiment of a method to perform flag decompression.

In FIG. 3 the packets are received at 40. The decompressor or main processor must first determine if the data is compressed or uncompressed. One option on the compressor end, to identify that the data is compressed, is to put in a compression header. However, this seems counter to the idea of a clear channel, where the bandwidth should be maximized for data, not for overhead information. One embodiment of the invention would involve the use of headerless compression.

In headerless compression, the decompressor would look at the size of the packet. If the packet size is the same as if the data had not been compressed, the decompressor assumes that the data is uncompressed at 42. If the data size is smaller, then the decompressor assumes that the data is compressed and the decompressor operates to decompress the data.

To decompress the data, the decompressor locates any occurrences of the identifier sequence at 44. If the sequence repeats itself at 46, the decompressor then 'removes' the repetitions of the identifier sequence at 48 such that only one identifier sequence occurs in the decompressed data. Typically, a decompressor will generate a data stream to mimic the incoming data stream, not actually 'remove' data from the stream. Since the repetition of the identifier sequence indicates that a single occurrence of the identifier has occurred in uncompressed text, this results in a single occurrence of the sequence in the decompressed text.

If the identifier sequence does not repeat, then the next byte contains the repetition count. The sequence to be repeated then follows and may either be the 8-bit flag, or the byte sequence resulting from sharing. The decompressor then repeats the sequence as many times as necessary to reach the count. This reconstructs the original data stream with no loss.

Once the data stream has been decompressed, the data is processed at 52. The data is either decompressed data from the decompressor, or uncompressed data that was not compressed to begin with. Both of these are referred to as uncompressed data at 52. Further processing may occur in the network device, or it may be 'processed' by being transmitted to another network device.

Figure 4:
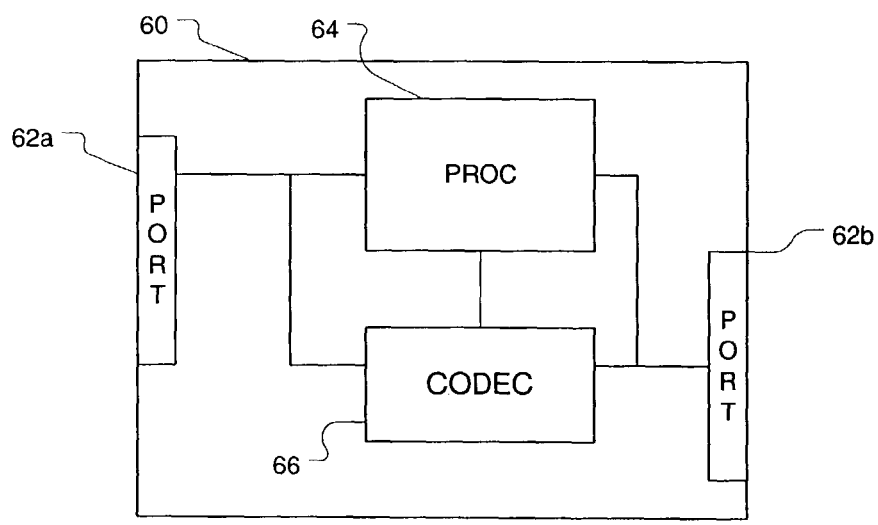
FIG. 4 shows an embodiment of a network device capable of flag compression or decompression.

An embodiment of a network device that could be either the originating or terminating endpoint is shown in FIG. 4. The network device has at least one port 62*a*, but may have multiple ports such as 62*b*. For ease of illustration, port 62*a* is shown as being the ingress port and port 62*b* is shown as being the egress port, but one port could perform both functions. The processor 64, which may also be referred to as the main processor, handles signaling and other processing of the data determined by the function of the network device. The encoder/decoder, or 'codec,' 66 performs the compression, decompression or both.

As most network devices both send and receive data, a typically network device will need to both compress and decompress data. However, the codec 66 may be just a decompressor or just a compressor. Similarly, it may reside with another device performing the opposite function, or not. The network device could act as the origination endpoint capable of transmitting compressed data, or as the terminating endpoint capable of receiving and decompressing the data.

In one embodiment of the invention, the network device is a pre-existing device that can be upgraded with the new instructions that allow it to implement the methods of the invention. For example, the methods of the invention could be contained on an article of processer-readable media containing code that, when executed, cause the network device processer to perform the methods of the invention.

Thus, although there has been described to this point a particular embodiment for a method and apparatus for multi-epoch codebook learning, it is not intended that such specific references be considered as limitations upon the scope of this invention except in-so-far as set forth in the following claims.

What is claimed is:

1. A network device, comprising:
    a port to allow the device to communicate on a full bandwidth channel;
    a main processor to control reception and transmission of data across a network using headerless compression; and
    a compressor to:
        determine if a compression operation would result in a compression of data;
        identify repetitions of a fixed sequences in the data;
        replace any occurrences of an identifier sequence in uncompressed data with two occurrences of the identifier sequence to identify the identifier sequence as data; and
        replace the repetitions with a single instance of the identifier sequence, a count of the repetitions and one instance of the fixed sequence, to produce compressed data.

2. The network device of claim 1, the compressor further comprising a set of instructions operated upon by the processor.

3. The network device of claim 1, the compressor further comprising a second processor separate from the main processor.

4. The network device of claim 1, the compressor further comprising a digital signal processor.

5. The network device of claim 1, the network device further comprising a data network gateway.

6. A network device, comprising:
   a port to allow the device to communicate on a full bandwidth channel;
   a main processor to control reception and transmission of packets of data across a network using headerless compression; and
   a decompressor to:
      determine if the data is compressed by examining a size of the packets;
      if the data is compressed, locate an identifier sequence in compressed data;
      determine a number of occurrences of the identifier sequence;
      if there are two occurrences of the identifier sequence in order, alter the data such that only one identifier sequence remains as decompressed data;
      if there is one occurrence of the identifier sequence, locate a count of repetitions and a fixed sequence in the data;
      remove the identifier sequences and the count of repetitions; and
      repeat the fixed sequence up to the count of repetitions, producing decompressed data.

7. The network device of claim 6, the decompressor further comprising a set of instructions operated upon by the processor.

8. The network device of claim 6, the decompressor further comprising a second processor separate from the main processor.

9. The network device of claim 6, the decompressor further comprising a digital signal processor.

10. A method of compressing data, the method comprising:
    identifying any repetitions of a fixed sequences in a data packet to be transmitted across a network on a full bandwidth channel;
    determining if a compression operation would result in a compression of data;
    if the compression operation results in a compression of data:
       replacing any occurrences of an identifier sequence in uncompressed data with two occurrences of the identifier sequence to identify the identifier sequence as data; and
       replacing the repetitions with a single instance of the identifier sequence, a count of the repetitions of the fixed sequence and one instance of the fixed sequence, producing compressed data; and
    transmitting the compressed data using headerless compression.

11. The method of claim 10, the method further comprising:
    if the compression operation results in an expansion of data, then transmitting uncompressed data.

12. The method of claim 10, determining if a compression operation would result in a compression of data further comprising determining if a compression operation results in a data size less than an uncompressed data size.

13. The method of claim 10, replacing the repetitions further comprising replacing the repetitions with an identifier sequence, a count of repetitions, a string size and one instance of the fixed sequence.

14. A method of decompressing data, the method comprising:
    receiving packets of data across a network over a full bandwidth channel;
    determining if the packets are of compressed data by examining a size of the packets;
    if the packets are of compressed data:
       locating any double occurrences of an identifier sequence in the compressed data;
       removing one occurrence of the identifier sequence in the compressed data such that one occurrence remains in decompressed data; and
       locating single occurrences of the identifier sequences, count of repetitions and a fixed sequence in the data; and
       repeating the fixed sequence up to the count of repetitions, producing decompressed data.

15. The method of claim 14 further comprising processing the packets as uncompressed data if the packets are uncompressed.

16. The method of claim 14 further comprising repeating a last segment of data, if data is not received during a predetermined period of time.

17. The method of claim 14 determining if the packets are compressed data further comprising determining if the packet size correspond to a packet of uncompressed data.

18. The method of claim 14, locating identifier sequences in the data further comprising locating the identifier sequence, with a count of repetitions, the fixed sequence and a string size.

19. A network device, comprising:
    a means for allowing the device to communicate on a full bandwidth channel;
    a means for controlling reception and transmission of data across a network using headerless compression; and
    a means for:
       determining if a compression operation would result in a compression of data;
       identifying repetitions of a fixed sequence in the data;
       replacing any occurrences of an identifier sequence in uncompressed data with two occurrences of the identifier sequence to identify the identifier sequence as data; and
       replacing the repetitions with a single instance of the identifier sequence, a count of the repetitions and one instance of the fixed sequence, to produce compressed data.

20. The network device of claim 19, the means for identifying further comprising a set of instructions operated upon by the means for controlling.

21. The network device of claim 19, the means for allowing being separate from the means for identifying.

22. A non-transitory computer readable media containing instructions that, when executed, cause a processor to:
    identify any repetitions of a fixed sequences in a data packet transmitted on a full bandwidth channel;
    determine if a compression operation would result in a compression of data; if the compression operation results in a compression of data:
       replace any occurrences of an identifier sequence in uncompressed data with two occurrences of the identifier sequence to identify the identifier sequence as data; and
       replace the repetitions with a single instance of the identifier sequence, a count of the repetitions of the fixed sequence and one instance of the fixed sequence, producing compressed data; and
    transmit the compressed data across a network using headerless compression.

23. The non-transitory computer readable media of claim 22, wherein the instructions, when executed, further cause the processor to:
if the compression operation results in an expansion of data, transmit uncompressed data.

24. The non-transitory computer readable media of claim 22, wherein the instructions, when executed, cause the processor to determine if a compression operation would result in a compression of data further causes the processor to determine if a compression operation results in a data size less than an uncompressed data size.

25. The non-transitory computer readable media of claim 22, wherein the instructions, when executed, further cause the processor to replace the repetitions further causes the machine to replace the repetitions with an identifier sequence, a count of repetitions, a string size and one instance of the fixed sequence.

26. A non-transitory computer readable media containing instructions that, when executed, cause a processor to:
receive packets of data across a network over a full bandwidth channel;
determine if the packets are of compressed data by examining a size of the packets;
if the packets are of compressed data:
locate any double occurrences of an identifier sequence in the compressed data;
remove one occurrence of the identifier sequence in the compressed data such that one occurrence remains in decompressed data; and
locate single occurrences of the identifier sequences, count of repetitions and a fixed sequence in the data; and
repeat the fixed sequence up to the count of repetitions, producing decompressed data.

27. The non-transitory computer readable media of claim 26, wherein the instructions, when executed, cause the processor to process the packets as uncompressed data if the packets are uncompressed.

28. The non-transitory computer readable media of claim 26 wherein the instructions, when executed, further cause the processor the processor to repeat a last segment of data, if data is not received during a predetermined period of time.

29. The non-transitory computer readable media of claim 26 wherein the instructions, when executed, cause the processor to determine if the packets are compressed data further causes the machine to determine if the packet size corresponds to a packet of uncompressed data.

30. The non-transitory computer readable media of claim 26, wherein the instructions, when executed, cause the processor to locate identifier sequences in the data further causes the machine to locate the identifier sequence, with a count of repetitions, the fixed sequence and a string size.

* * * * *

UNITED STATES PATENT AND TRADEMARK OFFICE
CERTIFICATE OF CORRECTION

| | | |
|---|---|---|
| PATENT NO. | : 7,908,399 B2 | Page 1 of 1 |
| APPLICATION NO. | : 10/449953 | |
| DATED | : March 15, 2011 | |
| INVENTOR(S) | : Mehryar Khalili Garakani et al. | |

It is certified that error appears in the above-identified patent and that said Letters Patent is hereby corrected as shown below:

Column 4, line 53, the word "sequences" should read -- sequence --.

Signed and Sealed this
Twenty-eighth Day of February, 2012

David J. Kappos
*Director of the United States Patent and Trademark Office*